(12) United States Patent
Kim et al.

(10) Patent No.: US 10,476,185 B2
(45) Date of Patent: Nov. 12, 2019

(54) DISPLAY DEVICE

(71) Applicant: Samsung Display Co., Ltd., Yongin-Si (KR)

(72) Inventors: Myungchul Kim, Asan-si (KR); Nam-sik Ko, Yongin-si (KR); Sedae Ki, Yongin-si (KR); Moonju Kim, Hwaseong-si (KR); Sangkueon Lee, Asan-si (KR); Seunghoon Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/252,707

(22) Filed: Jan. 21, 2019

(65) Prior Publication Data

US 2019/0229446 A1 Jul. 25, 2019

(30) Foreign Application Priority Data

Jan. 22, 2018 (KR) .................. 10-2018-0007873

(51) Int. Cl.
*H01R 12/52* (2011.01)
*H05K 1/14* (2006.01)
(Continued)

(52) U.S. Cl.
CPC .............. *H01R 12/52* (2013.01); *H05K 1/09* (2013.01); *H05K 1/111* (2013.01); *H05K 1/147* (2013.01); *G02F 1/13452* (2013.01); *H01L 27/3276* (2013.01); *H01L 51/5237* (2013.01); *H01L 2224/05001* (2013.01); *H05K 2201/0326* (2013.01); *H05K 2201/10128* (2013.01); *H05K 2201/10136* (2013.01)

(58) Field of Classification Search
CPC ......... H01L 27/3276–3279; G09G 2300/0426; H05K 1/111
See application file for complete search history.

(56) References Cited

U.S. PATENT DOCUMENTS

| 8,310,645 | B2 | 11/2012 | Matsui et al. |
| 9,490,312 | B2 | 11/2016 | Lee et al. |
| (Continued) | | | |

FOREIGN PATENT DOCUMENTS

| JP | 5226070 | 7/2013 |
| KR | 10-2015-0102167 | 9/2015 |
| (Continued) | | |

*Primary Examiner* — Amar Movva
(74) *Attorney, Agent, or Firm* — H.C. Park & Associates, PLC

(57) ABSTRACT

A display device including a display panel including a base substrate, a plurality of pixels disposed on the base substrate, and a plurality of panel pad rows that are spaced apart from the pixels in a first direction. Each of the panel pad rows includes a plurality of panel pads arranged in a second direction crossing the first direction in a perpendicular manner, a connecting circuit board disposed on the display panel and connected to the panel pads, and a connection member disposed between the display panel and the connecting circuit board to electrically connect the display panel to the connecting circuit board. A minimum-spaced distance between an edge of the base substrate and the panel pads adjacent thereto may be optimized to improve an adhesion property and an electrical connection reliability between the panel pads and the connecting circuit board.

20 Claims, 10 Drawing Sheets

(51) Int. Cl.
*H05K 1/11* (2006.01)
*H05K 1/09* (2006.01)
*H01L 51/52* (2006.01)
*G02F 1/1345* (2006.01)
*H01L 27/32* (2006.01)

(56) References Cited

U.S. PATENT DOCUMENTS 9,502,393 B2 11/2016 Shin et al.
9,541,809 B2 1/2017 Han et al.
9,768,106 B2 9/2017 Cho et al.

FOREIGN PATENT DOCUMENTS

| KR | 10-2016-0009152 | 1/2016 |
| KR | 10-2016-0026340 | 3/2016 |
| KR | 10-2016-0027788 | 3/2016 |
| KR | 10-2016-0031088 | 3/2016 |
| KR | 10-2016-0091595 | 8/2016 |
| KR | 10-1682363 | 11/2016 |

DISPLAY DEVICE

CROSS-REFERENCE TO RELATED APPLICATION

This application claims priority from and the benefit of Korean Patent Application No. 10-2018-0007873, filed on Jan. 22, 2018, which is hereby incorporated by reference for all purposes as if fully set forth herein.

BACKGROUND

Field

Exemplary embodiments of the invention relate generally to a display device, and more specifically, to a display device in which arrangement of panel pads and disposition of a connecting circuit board electrically connected to the panel pads are optimized.

Discussion of the Background

Various display devices used for multimedia devices such as a television, a mobile phone, a tablet computer, a navigation unit, and a game console have been developed, and such display devices are electrically connected to external electronic components in order to receive a signal provided from the outside and provide an image.

Also, as small-sized display devices having high resolution have been developed, a structure for arranging pads, which are connected to a driver integrated circuit (D-IC) for driving the display devices or the like, in a limited space with a high degree of integration has been suggested. However, when the space, in which the pads are disposed, is not sufficiently secured, a connection reliability between the pads and the driver integrated circuit may be degraded.

The above information disclosed in this Background section is only for understanding of the background of the inventive concepts, and, therefore, it may contain information that does not constitute prior art.

SUMMARY

Exemplary embodiments of the invention provide a display device in which, as a distance between a panel pad and a protective layer of a connecting circuit board is sufficiently secured to increase an adhesion force of a connection member, attachment characteristics of the panel pad are enhanced.

Additional features of the inventive concepts will be set forth in the description which follows, and in part will be apparent from the description, or may be learned by practice of the inventive concepts.

An exemplary embodiment of the inventive concepts provide a display device including: a display panel including a base substrate, a plurality of pixels disposed on the base substrate, and a plurality of panel pad rows that are spaced apart from the pixels in a first direction. Each of the panel pad rows includes a plurality of panel pads arranged in a second direction crossing the first direction in a perpendicular manner; a connecting circuit board disposed on the display panel and connected to the panel pads; and a connection member disposed between the display panel and the connecting circuit board to electrically connect the display panel to the connecting circuit board. The minimum-spaced distance between an edge of the base substrate and the panel pads, which are adjacent to the edge of the base substrate, is equal to or greater than about 0.95 mm and equal to or less than about 1.25 mm.

The connecting circuit board may include: a flexible board; a plurality of connecting pads disposed on the flexible board in correspondence to the panel pads; and a protective layer disposed on the flexible board.

The protective layer may have an edge overlapping the base substrate.

A minimum-spaced distance between the edge of the protective layer and the panel pads, which are adjacent to the edge of the base substrate, may be equal to or greater than about 0.20 mm and equal to or less than about 0.50 mm.

The connecting circuit board may include: a flexible board having a connecting pad area; a protective layer disposed on the flexible board to expose the connecting pad area; and a plurality of connecting pad rows disposed on the connecting pad area. Each of the connecting pad rows may include a plurality of connecting pads corresponding to the panel pads.

A minimum-spaced distance between the edge of the protective layer and the panel pads, which are adjacent to the edge of the protective layer, may be equal to or greater than about 0.20 mm and equal to or less than about 0.50 mm.

The base substrate may include a flat portion, on which the panel pads are disposed, and an inclined portion having a thickness that gradually decreases toward the edge of the base substrate.

The protective layer may have an edge overlapping the flat portion on a plane.

The panel pad rows may include: a first pad row adjacent to the edge of the base substrate and including a first panel pad; and a second pad row in parallel to the first pad row and including a second panel pad.

A minimum-spaced distance between the first panel pad and the second panel pad adjacent to the first panel pad in the first direction may be equal to or greater than about 0.15 mm and equal to or less than about 0.35 mm.

A minimum distance between a first imaginary line passing through a center of the first panel pad and a second imaginary line passing through a center of the second panel pad adjacent to the first panel pad and in parallel to the first imaginary line may be equal to or greater than about 29 μm and equal to or less than about 33 μm.

The display device may further include a driving circuit board electrically connected to the connecting circuit board and including a plurality of driving pads.

The display panel may be a liquid crystal display panel, and the base substrate may be a lower substrate of the liquid crystal display panel.

The display panel may be an organic electroluminescent display panel including an organic light emitting element layer disposed on the base substrate and an encapsulation layer disposed on the light emitting element layer.

The connection member may include a base resin and conductive particles.

The connection member may be filled between the base substrate and the flexible board, which face each other.

Each of the panel pads may include at least one transparent metallic oxide of an indium tin oxide (ITO), an indium zinc oxide (IZO), an indium tin zinc oxide (ITZO), a zinc tin oxide (ZTO), and an antimony tin oxide (ATO).

Another exemplary embodiment of the inventive concepts provides a display device including: a plurality of panel pads divided into a display area, a non-display area, and a pad area on a plane and arranged in a form of a plurality of rows on the pad area; a connecting circuit board including a flexible board, a plurality of connecting pads disposed on the flexible board and arranged in correspondence to the panel pads, and a protective layer disposed on the flexible board and having an edge overlapping the display panel; a driving circuit board configured to provide a driving signal to the display panel and including a plurality of driving pads; a first connection member disposed between the panel pads and the connecting circuit board; and a second connection member disposed between the connecting circuit board and the driving circuit board. A minimum-spaced distance between a panel pad, which is adjacent to an edge of the display panel, of the panel pads and an edge of the protective layer is equal to or greater than about 0.20 mm and equal to or less than about 0.50 mm.

Another exemplary embodiment of the inventive concepts provides a display device including: a display panel including a base substrate and a plurality of panel pads disposed in two rows on the base substrate while being adjacent to an edge of the base substrate; a connecting circuit board electrically connected to the display panel; and a connection member disposed between the connecting circuit board and the display panel. A minimum-spaced distance between a panel pad, which is adjacent to an edge of the base substrate, of the panel pads and an edge of the base substrate is equal to or greater than about 0.95 mm and equal to or less than about 1.25 mm.

The connecting circuit board may include: a flexible board; a plurality of connecting pads disposed on the flexible board and disposed in correspondence to the panel pads; and a protective layer disposed on the flexible board. The protective layer may have an edge overlapping the base substrate on a plane.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
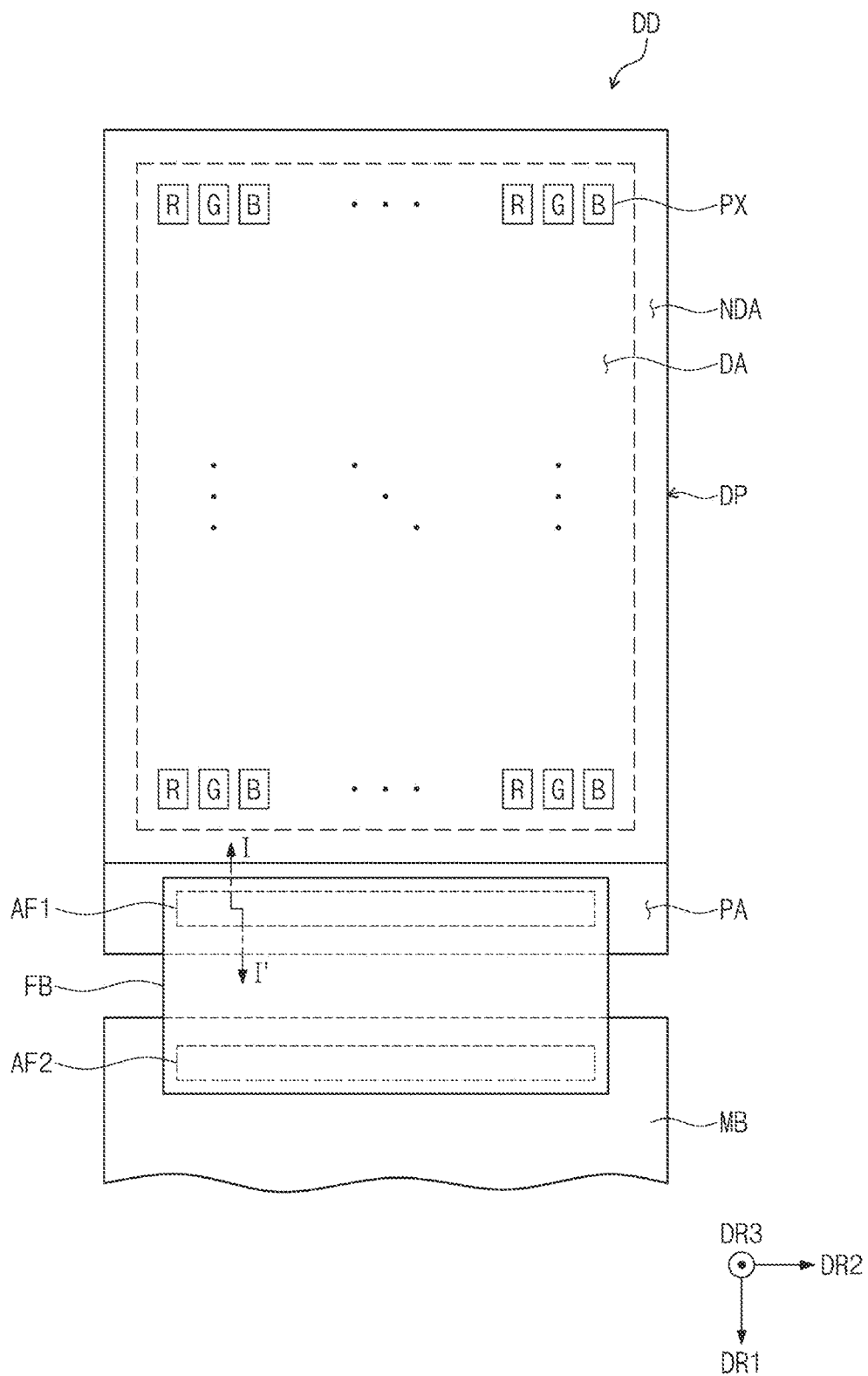
FIG. 1 is a plan view illustrating a portion of a display device according to an exemplary embodiment.

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, a display device according to an exemplary embodiment of the inventive concepts will be described with reference to the accompanying drawings.

Figure 2:
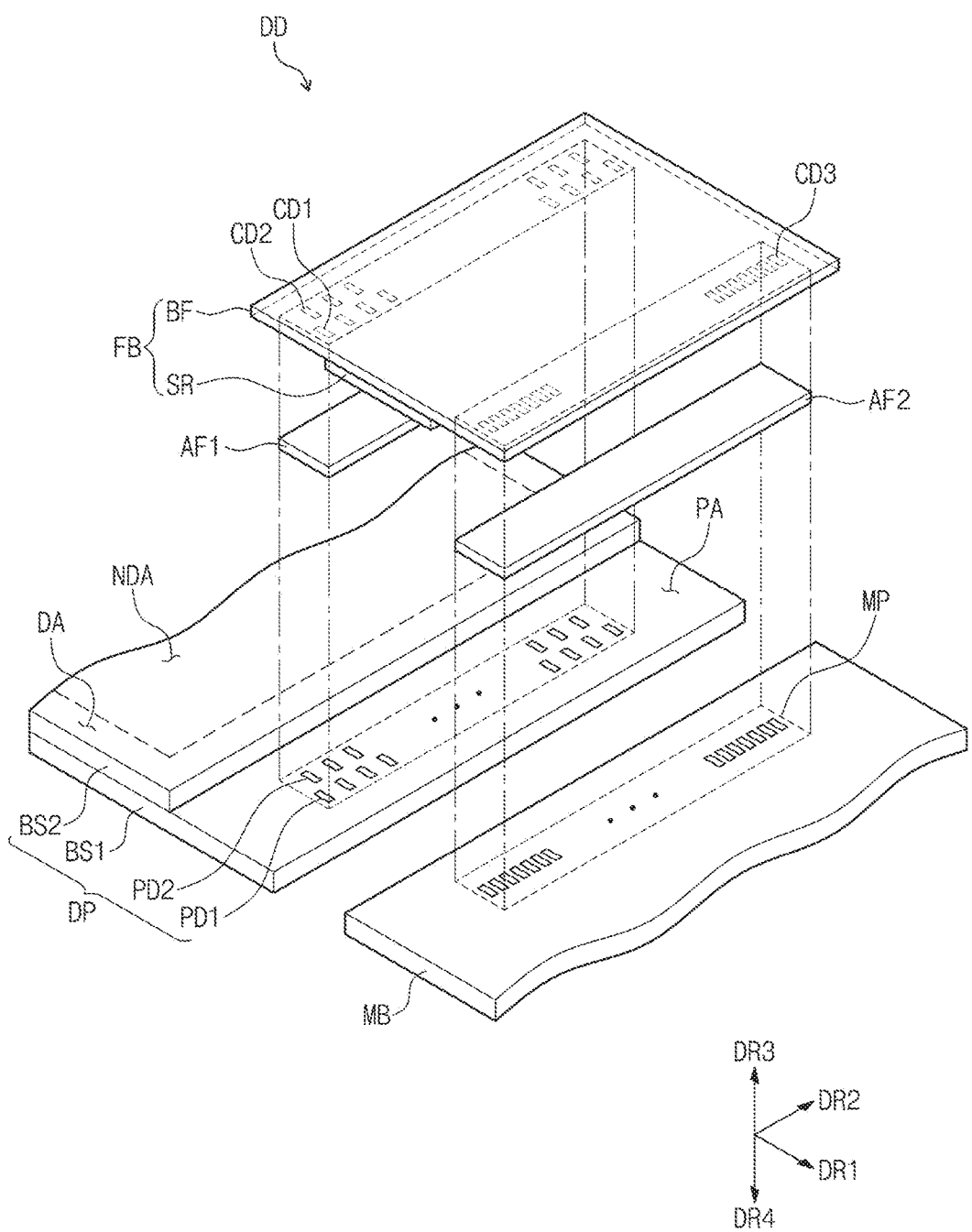
FIG. 2 is an exploded perspective view illustrating a portion of a display device according to an exemplary embodiment.
Figure 3:
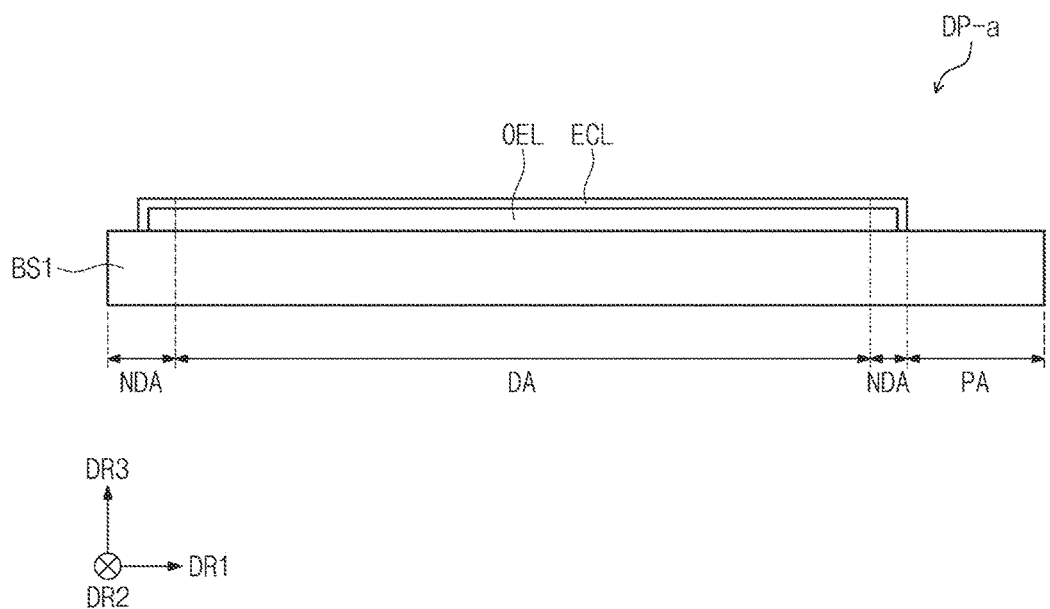
FIG. 3 is a cross-sectional view illustrating an embodiment of a display panel included in a display device according to an exemplary embodiment.
Figure 4:
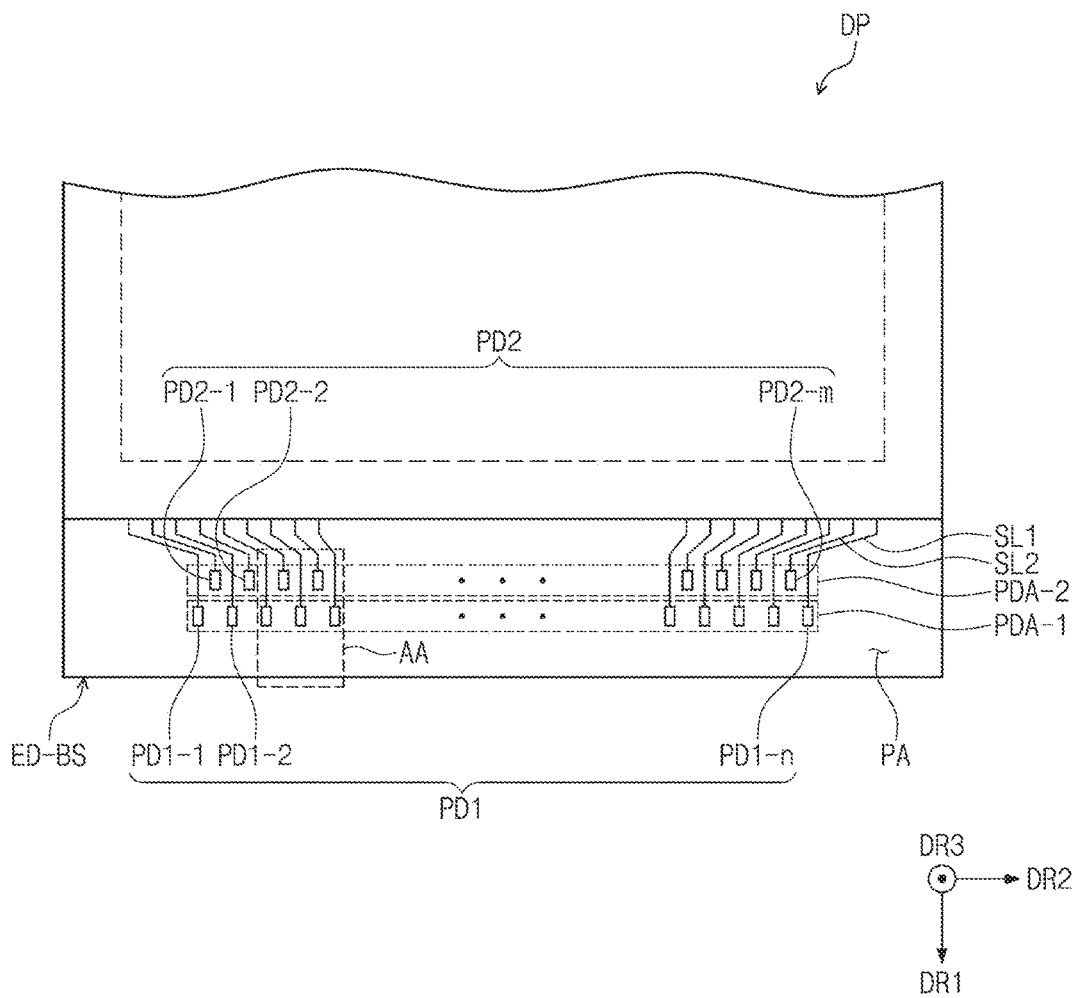
FIG. 4 is a plan view illustrating a portion of a display panel included in a display device according to an exemplary embodiment.
Figure 5:
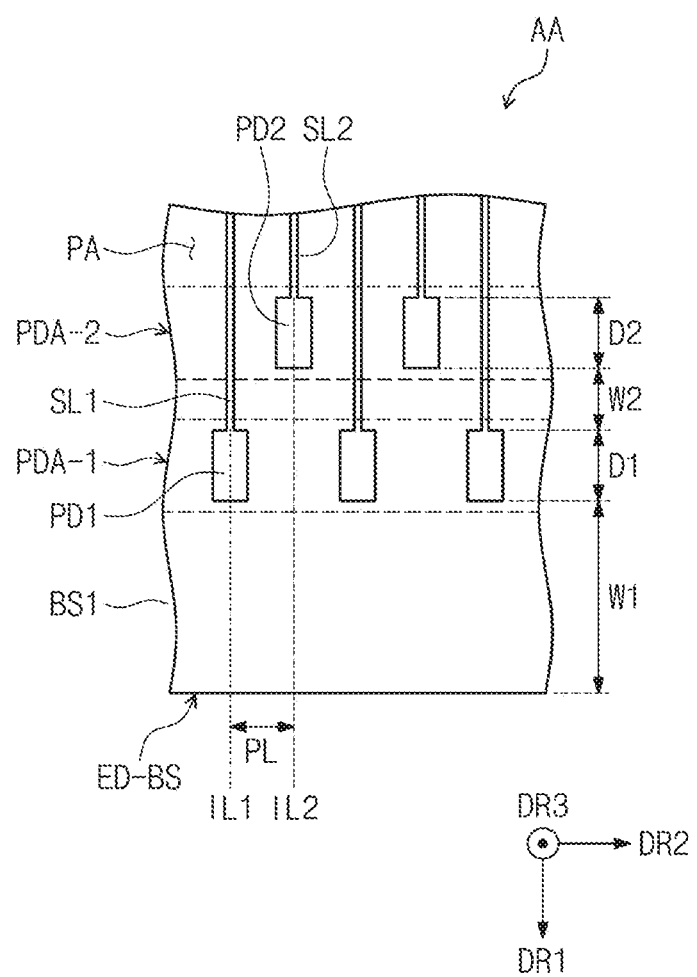
FIG. 5 is a plan view illustrating a region AA of FIG. 4.
Figure 6:
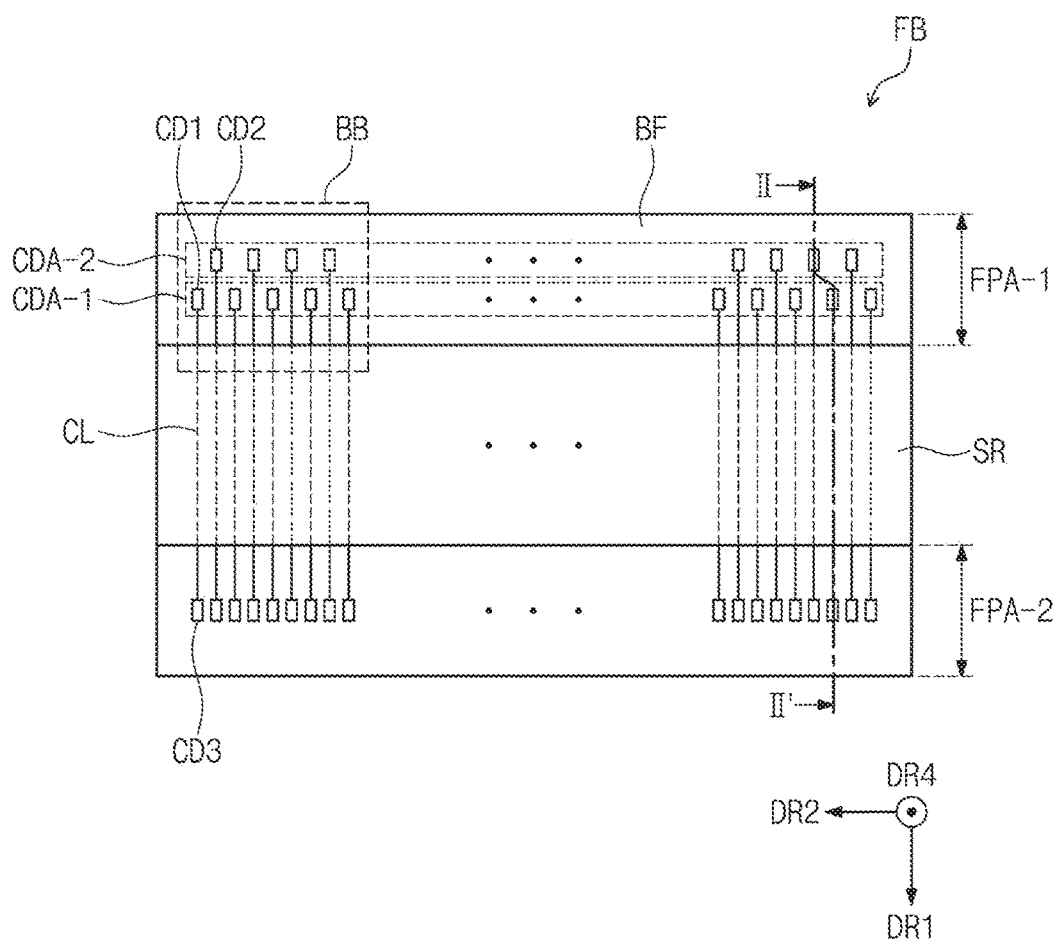
FIG. 6 is a plan view illustrating a connecting circuit board included in a display device according to an exemplary embodiment.
Figure 7A:
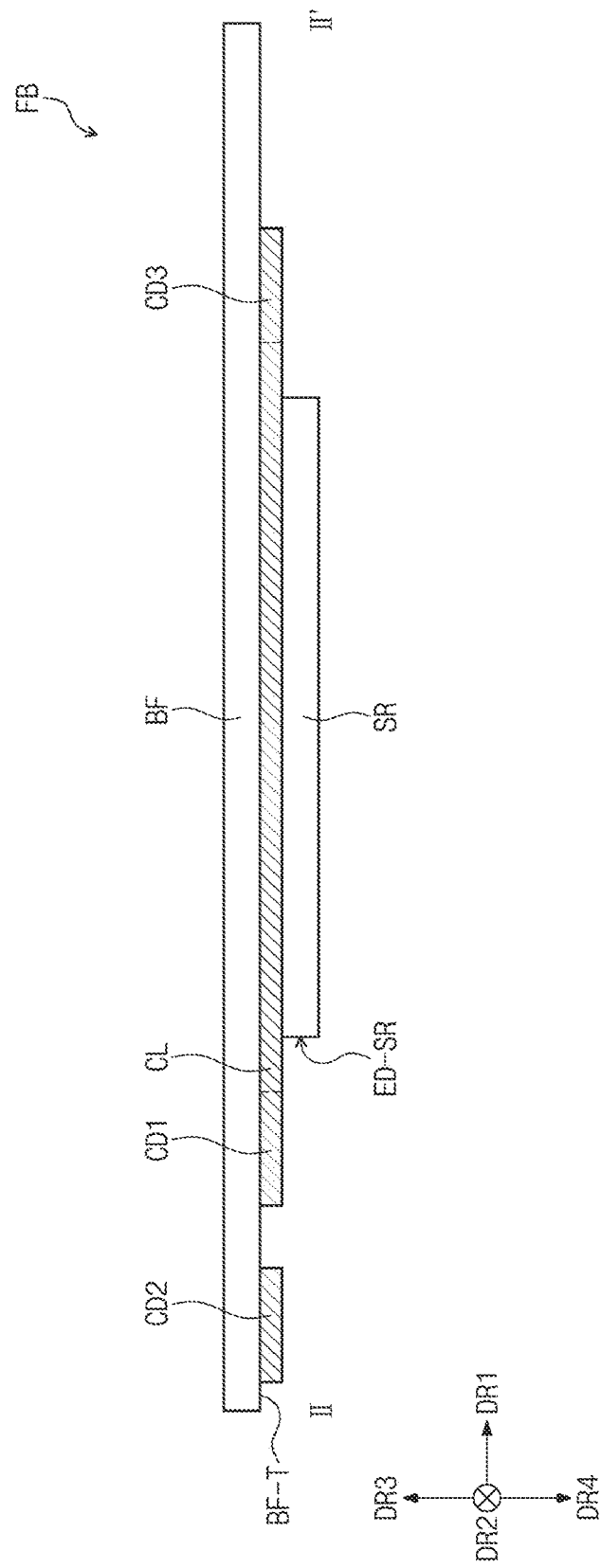
FIG. 7A is a cross-sectional view taken long line II-II' of FIG. 6.
Figure 7B:
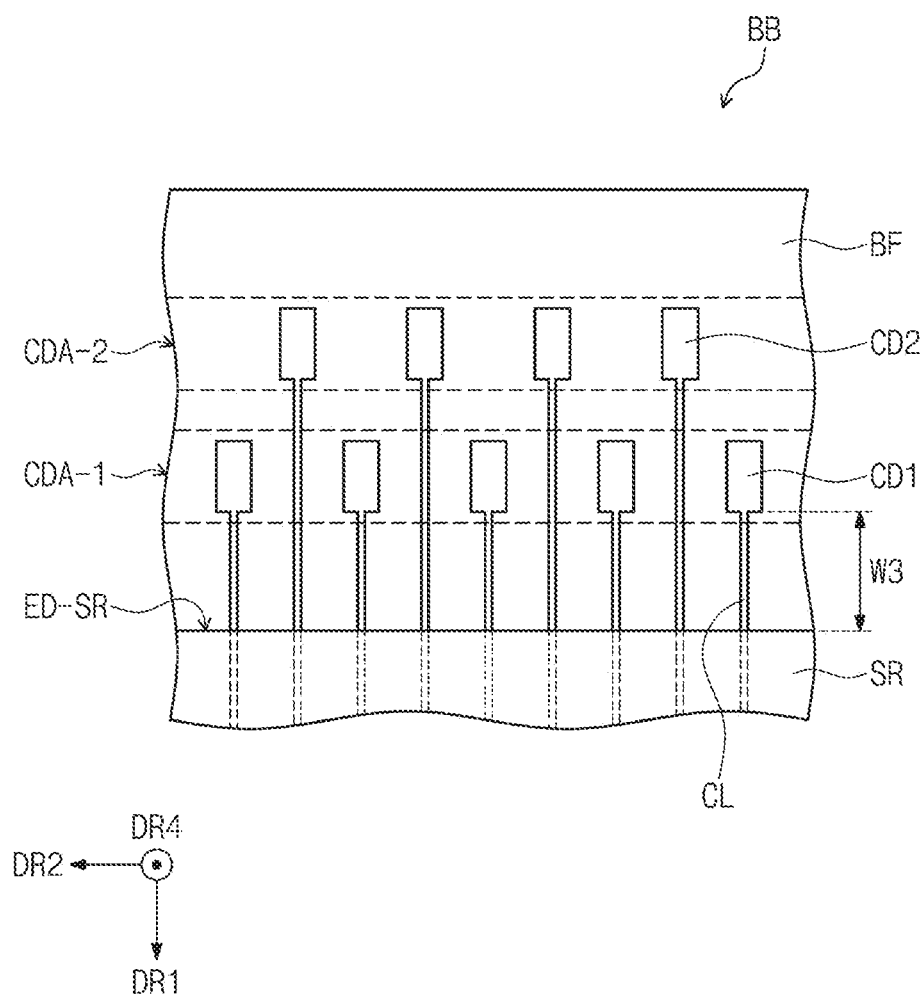
FIG. 7B is a plan view illustrating a region BB of FIG. 6.

FIG. 1 is a plan view of a display device according to an exemplary embodiment. FIG. 2 is an exploded perspective view of the display device according to the embodiment illustrated in FIG. 1. FIG. 3 is a cross-sectional view illustrating an exemplary embodiment of a display panel included in a display device according to an exemplary embodiment. FIGS. 4 and 5 are plan views illustrating the display panel included in the display device according to the exemplary embodiment in FIG. 1, FIGS. 6 and 7B are plan views illustrating a connecting circuit board included in the display device according to the exemplary embodiment illustrated in FIG. 1, and FIG. 7A is a cross-sectional view illustrating the connecting circuit board illustrated in FIG. 6.

Referring to FIGS. 1 and 2, a display device DD according to an exemplary embodiment may include a display panel DP, a connecting circuit board FB, and connection members AF1 and AF2. The display device DD may further include a driving circuit board MB, and the connecting circuit board FB may be disposed between the display panel DP and the driving circuit board MB. In the display device DD according to an exemplary embodiment, the display panel DP, the connecting circuit board FB, and the driving circuit board MB may be electrically connected to each other. Also, the display device DD according to an exemplary embodiment may include the connection members AF1 and AF2 disposed between the display panel DP and the connecting circuit board FB and between the driving circuit board MB and the connecting circuit board FB, respectively.

The display panel DP may include a liquid crystal display panel, an organic light emitting display panel, a plasma display panel, an electrophoretic display panel, a microelectromechanical system display panel, and an electrowetting display panel. For example, in the display device DD according to an exemplary embodiment, the display panel DP may be a liquid crystal display panel or an organic light emitting display panel. However, the inventive concepts are not limited thereto.

The display panel DP may be flexible. "Flexible" may represent a bendable characteristic and include all structures from a structure completely folded to a structure bendable in a several nanometer level. For example, the display panel DP may include a curved display panel or a foldable display panel. Also, the display panel DP may be rigid.

Referring to FIGS. 1 to 5, the display panel DP may include a base substrate BS1, a plurality of pixels PX disposed on the base substrate BS1, and a plurality of panel pad rows PDA-1 and PDA-2 disposed on the base substrate BS1. The panel pad rows PDA-1 and PDA-2 may include a plurality of panel pads PD1 and PD2, respectively.

The base substrate BS1 may include a silicon substrate, a glass substrate, a plastic substrate, or a flexible film. The base substrate BS1 may have an insulation property. Although not shown, the base substrate BS1 may include a driving element and a signal wire of the pixel PX. Accordingly, the base substrate BS1 may have a laminated structure including a plurality of conductive layers and a plurality of organic films and/or inorganic films.

For example, in the display device DD according to the exemplary embodiment illustrated in FIG. 2, the display panel DP may be a liquid crystal display panel. The display panel DP may be a liquid crystal display panel including a base substrate BS1 and a counter substrate BS2 facing each other, with a liquid crystal layer (not shown) therebetween. When the display panel DP is a liquid crystal display panel, the base substrate BS1 may be a lower substrate, and the counter substrate BS2 may be an upper substrate. For example, the base substrate BS1 may be an array substrate on which a circuit layer, such as a thin film transistor (not shown), is formed, and the counter substrate BS2 may be a color filter substrate including a color filter. However, the inventive concepts are not limited thereto.

Alternatively, in the display device DD according to an exemplary embodiment, the display panel DP may be an organic light emitting display panel. FIG. 3 is a cross-sectional view illustrating an example in which the display panel DP is the organic light emitting display panel. Referring to FIG. 3, a display panel DP-a may include a base substrate BS1, an organic light emitting element layer OEL, and an encapsulation layer ECL, which are laminated in direction of a third directional axis DR3 on a cross-section.

In the display panel DP-a, the base substrate BS1 may be a base layer on which the organic light emitting element layer OEL is formed. The base substrate BS1 may include a single layer or a plurality of insulation layers. The base substrate BS1 may be at least one of a glass substrate, a plastic substrate, a film, and a laminate including a plurality of organic films and/or inorganic films. However, the inventive concepts are not limited thereto.

The organic light emitting element layer OEL is disposed on the base substrate BS1. The organic light emitting element layer OEL may be electrically connected to the driving element and the signal wire of the base substrate BS1. The organic light emitting element layer OEL may include an organic electroluminescent diode.

The encapsulation layer ECL may be disposed on the organic light emitting element layer OEL to protect the organic light emitting element layer OEL. The encapsulation layer ECL may cover the organic light emitting element layer OEL. The encapsulation layer ECL may also cover a side surface of the organic light emitting element layer OEL. For example, the encapsulation layer ECL may be a thin film encapsulation layer. In an exemplary embodiment, the encapsulation layer ECL may be replaced by an encapsulation substrate. Also, the encapsulation layer ECL may be omitted from the display panel DP-a.

The display panel DP may be divided into a display area DA, a non-display area NDA, and a pad area PA. The plurality of panel pads PD1 and PD21 may be arranged in a form of a plurality of rows in the pad area PA.

In an exemplary embodiment, the display area DA of the display panel DP may be an area on which an image is displayed. A plurality of pixels PX for realizing an image may be disposed on the display area DA. The pixels PX may be arranged in a form of a matrix in a direction of a first directional axis DR1 and a direction of a second directional axis DR2. The display panel DP controls the pixels PX to display various images.

Each of the pixels PX may include a display element and a driving element. The display element may be implemented in various ways. For example, the display element may include at least one of a liquid crystal capacitor, an organic electroluminescent element, an electrophoretic element, and an electrowetting element. However, these are merely examples, and the display element may be implemented in many ways as long as the display element realizes an image according to an electric signal.

The driving element controls each of the display elements of each of the pixels PX to be driven. The driving element may include a thin film transistor. The display panel DP may be actively driven to independently control each of the pixels PX.

In an exemplary embodiment, the pixels PX may include first to third pixels displaying a red color R, a green color G, and a blue color B, respectively. However, the inventive concepts are not limited thereto. For example, the plurality of pixels PX may further include a portion of pixels (not shown) displaying white, cyan, and magenta, respectively. A portion in which the pixels PX are arranged may be defined as the display area DA of the display panel DP.

The non-display area NDA may be disposed adjacent to the display area DA. The non-display area NDA may surround an edge of the display area DA and be disposed outside the display area DA. However, the inventive concepts are not limited thereto. For example, the non-display area NDA may be provided on at least one side edge of the display area DA.

Signal wires SL1 and SL2 connected to the pixels PX may be disposed on the non-display area NDA. In the exemplary embodiment illustrated in FIG. 1, the non-display area NDA may have a frame shape surrounding the display area DA.

The pad area PA may be disposed adjacent to the non-display area NDA. The pad area PA may be connected to the connecting circuit board FB. The display panel DP may be electrically connected to external electronic components such as the connecting circuit board FB and the driving circuit board MB through the panel pads PD1 and PD2 disposed on the pad area PA.

Referring to FIGS. 1 and 5, in the display device DD according to an exemplary embodiment, the pad area PA may be disposed on one end of the display panel DP. In an exemplary embodiment, the pad area PA may be disposed at one side of the display area DA. The pad area PA may be disposed adjacent to one side of the non-display area NDA. The plurality of panel pads PD1 and PD2 may be disposed on the pad area PA. The display panel DP may receive an electrical signal from or output an electrical signal to the outside through the panel pads PD1 and PD2 disposed on the pad area PA. For example, the panel pads PD1 and PD2 may be input pads. The panel pads PD1 and PD2 may be connected to the signal wires SL1 and SL2.

The panel pads PD1 and PD2 may be electrically connected to the driving circuit board MB through the connecting circuit board FB. Each of the panel pads PD1 and PD2 may include copper (Cu), silver (Ag), or gold (Au) or a metallic oxide. For example, each of the panel pads PD1 and PD2 may include at least one transparent metallic oxide of indium tin oxide (ITO), indium tin zinc oxide (ITZO), zinc tin oxide (ZTO), and antimony tin oxide (ATO). Specifically, the panel pads PD1 and PD2 may be a patterned ITO. Also, the panel pads PD1 and PD2 may be electrically connected to the driving element for driving the pixels PX through the signal wires SL1 and SL2.

Referring to FIGS. 1 to 5, the display panel DP may include the base substrate BS1, the plurality of pixels PX disposed on the base substrate BS1, and the plurality of panel pad rows PDA-1 and PDA-2 disposed on the base substrate BS1. The plurality of panel pad rows PDA-1 and PDA-2 may include the plurality of panel pads PD1 and PD2, respectively, which are arranged in the direction of the second directional axis DR2 crossing the first directional axis DR1.

The plurality of panel pad rows PDA-1 and PDA-2 may be disposed on the pad area PA of the display panel DP. Although two panel pad rows PDA-1 and PDA-2 are disposed on the pad area PA of the display panel DP in FIGS.

2, 4, and 5, the inventive concepts are not limited thereto. For example, three or more panel pad rows may be disposed on the pad area PA.

The panel pad rows PDA-1 and PDA-2 may be spaced apart from the pixel PX of the display area DA in the direction of the first directional axis DR1. The panel pad rows PDA-1 and PDA-2 may be arranged in parallel with an edge ED-BS of the base substrate BS1. That is, in an exemplary embodiment, the panel pad rows PDA-1 and PDA-2 may be arranged in the direction of the second directional axis DR2. Referring to FIGS. 1, 2, and 5, although the panel pad rows PDA-1 and PDA-2 are disposed in parallel with a short side of the base substrate BS1, the inventive concepts are not limited thereto. For example, when the pad area PA is disposed on one side of the display area DA adjacent to a long side of the base substrate BS1, the panel pad rows PDA-1 and PDA-2 may be arranged in parallel with the long side of the base substrate BS1.

The panel pad rows PDA-1 and PDA-2 may include the plurality of panel pads PD1 and PD2, respectively. The panel pads PD1 and PD2 that are included in the plurality of panel pad rows PDA-1 and PDA-2, respectively, may be arranged in the direction of the second directional axis DR2 crossing the first directional axis DR1.

For example, in an exemplary embodiment, the display panel DP may include the first pad row PDA-1 adjacent to one end of the base substrate BS1 and the second pad row PDA-2 in parallel to and spaced apart from the first pad row PDA-1.

The first pad row PDA-1 may include n first panel pads PD1-1 to PD1-n. The first panel pads PD1 may be arranged while being spaced a predetermined distance from each other in the direction of the second directional axis DR2.

The second pad row PDA-2 may include m second panel pads PD2-1 to PD2-m. The second panel pads PD2 may be arranged while being spaced a predetermined distance from each other in the direction of the second directional axis DR2.

The reference symbol n that indicates the number of the first panel pads PD1 and the reference symbol m that indicates the number of the second panel pads PD2 may be equal to each other. Alternatively, the reference symbol n that indicates the number of the first panel pads PD1 and the reference symbol m that indicates the number of the second panel pads PD2 may be different from each other.

FIG. 4 is a plan view illustrating the display panel DP included in the display device DD according to an exemplary embodiment, and FIG. 5 is a plan view illustrating a region "AA" of FIG. 4. Referring to FIGS. 4 and 5, the first panel pads PD1 included in the first pad row PDA-1 adjacent to the edge ED-BS of the base substrate BS1 may be spaced apart from the edge ED-BS of the base substrate BS1, and a minimum-spaced distance W1 between the edge ED-BS of the base substrate BS1 and the first panel pads PD1 adjacent to the base substrate BS1 may be equal to or greater than about 0.95 mm and equal to or less than about 1.25 mm. For example, the minimum-spaced distance W1 between the edge ED-BS of the base substrate BS1 and the first panel pads PD1 adjacent to the base substrate BS1 may be equal to or greater than about 0.95 mm and equal to or less than about 1.15 mm. Specifically, the minimum-spaced distance W1 between the edge ED-BS of the base substrate BS1 and the first panel pads PD1 adjacent to the base substrate BS1 may be equal to or greater than about 0.95 mm and equal to or less than about 1.05 mm.

When the minimum-spaced distance W1 between the edge ED-BS of the base substrate BS1 and the first panel pads PD1 adjacent to the base substrate BS1 is less than about 0.95 mm, since an adhesion surface area of the first connection member AF1 that will be described later is not sufficiently secured, an adhesion property between the panel pads PD1 and the connecting circuit board FB may be degraded. Also, when the-minimum-spaced distance W1 between the edge ED-BS of the base substrate BS1 and the first panel pads PD1 adjacent to the base substrate BS1 is greater than about 1.25 mm, as the base substrate BS1 increases in length, and, particularly, the pad area PA increases in surface area, a dead space in the display panel DP may increase.

In an exemplary embodiment, the minimum-spaced distance W1 between the edge ED-BS of the base substrate BS1 and the first panel pads PD1 adjacent to the base substrate BS1 may increase by about 0.2 mm or more in comparison with the spaced distance between an edge of a base substrate and panel pads adjacent to the base substrate in a typical display device. That is, in comparison with the typical display device, the display device DD according to an exemplary embodiment may have a further extended-spaced distance between the edge ED-BS of the base substrate BS1 and the first panel pads PD1 included in the panel pad row PDA-1 adjacent to the edge ED-BS of the base substrate BS1, i.e., an extended length of the base substrate BS1 in the direction of the first directional axis DR1. As the length of the first base substrate BS1 is extended, and the surface area of the pad area PA decreases, and accordingly, the connection circuit board FB is disposed so that an edge ED-SR of a protective layer SR of the connecting circuit board FB overlaps in the pad area PA. As a result, the display device DD according to an exemplary embodiment may have an enhanced connection performance between the panel pads PD1 and PD2 and the connecting circuit board FB.

The panel pads PD1 and PD2 disposed on the base substrate BS1 of the display panel DP may have a rectangular shape. However, the inventive concepts are not limited thereto. For example, each of the panel pads PD1 and PD2 may have a shape of a trapezoid, a parallelogram, or a circle.

A length D1 of the first panel pad PD1 and a length D2 of the second panel pad PD2, which extend in the direction of the first directional axis DR1, may be equal to or different from each other. For example, although each of the length of the first panel pad PD1 and the length D2 of the second panel pad PD2 may be about 0.8 mm, the inventive concepts are not limited thereto. The length of the first panel pad PD1 and the length D2 of the second panel pad PD2 may be relatively adjusted according to a design of the panel pads PD1 and PD2.

Also, referring to FIGS. 4 and 5, the plurality of pad rows PDA-1 and PDA-2 may be spaced apart from each other in the direction of the first directional axis DR1. A minimum-spaced distance W2 between the first panel pad PD1 included in the first pad row PDA-1 and the second panel pad PD2 included in the second pad row PDA-2 in the direction of the first directional axis DR1 may be equal to or greater than about 0.15 mm and equal to or less than about 0.35 mm. For example, the minimum-spaced distance W2 between the first panel pad PD1 and the second panel pad PD2 in the direction of the first directional axis DR1 may be equal to or greater than about 0.18 mm and equal to or less than about 0.25 mm.

When the minimum-spaced distance W2 between the first panel pad PD1 and the second panel pad PD2 is less than about 0.15 mm, a short-circuit between the first panel pad PD1 and the second panel pad PD2 may occur. Also, when the minimum-spaced distance W2 between the first panel pad PD1 and the second panel pad PD2 is greater than about 0.35 mm, as the pad area increases in surface area, the dead space in the display panel DP may increase.

The plurality of panel pads PD1 and PD2 arranged on the pad area PA may have a pitch equal to or greater than about 29 µm and equal to or less than about 33 µm. A minimum distance PL between the first panel pad PD1 included in the first pad row PDA-1 and the second panel pad PD2, which is included in the second pad row PDA-2 and adjacent to the first panel pad PD1, in the direction of the second directional axis DR2 may be equal to or greater than about 29 µm and equal to or less than about 33 µm. For example, a minimum distance PL between a first imaginary line IL1 passing through a center of the first panel pad PD1 and a second imaginary line IL2 passing through a center of the second panel pad PD2 and in parallel to the first imaginary line IL1 may be equal to or greater than about 29 µm and equal to or less than about 33 µm. The minimum distance PL between the first imaginary line IL1 and the second imaginary line IL2 may correspond to the pitch between the panel pads PD1 and PD2.

Referring again to FIGS. 1 and 2, the display device DD according to an exemplary embodiment includes the connecting circuit board FB. The connecting circuit board FB may be disposed on the display panel DP and connected to the panel pads PD1 and PD2. For example, the connecting circuit board FB may have one end disposed on the pad area PA of the display panel DP.

FIG. 6 is a plan view illustrating a connecting circuit board FB included in a display device according to an exemplary embodiment, FIG. 7A is a cross-sectional view taken along line of FIG. 6, and FIG. 7B is an enlarged view illustrating a region "BB" of FIG. 6.

The connecting circuit board FB may include a flexible board BF, a plurality of connecting pads CD1, CD2, and CD3 disposed on the flexible board BF, and a protective layer SR. The connecting pads CD1, CD2, and CD3 and the protective layer SR may be disposed on one surface BF-T of the flexible board BF, which faces the base substrate BS1 The connecting pads CD1, CD2, and CD3 may be disposed on the flexible board BF in correspondence to the panel pads PD1 and PD2.

The connecting circuit board FB may include a connecting pad area FPA-1 and FPA-2. The connecting pad area FPA-1 and FPA-2 may indicate a portion of the flexible board BF, on which the protective layer SR is not disposed. In the connecting pad area FPA-1 and FPA-2, a portion of the connecting pads CD1, CD2, and CD3 and a portion of the connecting wire CL may be exposed.

The flexible board BF may be made of a flexible material, such as, e.g., polyimide. The flexible board BF may be provided in a film type.

The connecting pads CD1, CD2, and CD3 disposed on the flexible board BF may be an output pad or an input pad. The connecting circuit board FB may include a plurality of connecting pad rows CDA-1 and CDA-2 disposed on the one surface BF-T of the flexible board BF. The connecting pad rows CDA-1 and CDA-2 may include a plurality of connecting pads CD1 and CD2, respectively.

The connecting circuit board FB may be disposed on the display panel DP so that the connecting pad rows CDA-1 and CDA-2 arranged on the connecting pad area FPA-1 of the flexible board BF correspond to the pad rows PDA-1 and PDA-2 disposed on the pad area PA of the display panel DP.

For example, the connecting pad rows CDA-1 and CDA-2 may include a first connecting pad row CDA-1 corresponding to the first pad row PDA-1 and a second connecting pad row CDA-2 corresponding to the second pad row PDA-2. The first connecting pad row CDA-1 and the second connecting pad row CDA-2 may be spaced apart from each other in the direction of the first directional axis DR1.

The first connecting pad row CDA-1 may include a plurality of first connecting pads CD1, and the first connecting pads CD1 may be arranged in the direction of the second directional axis DR2. The first connecting pads CD1 may be electrically connected to the first panel pads PD1 of the display panel DP. For example, a first connection member AF that will be described later may be disposed between the first panel pads PD1 and the first connecting pads CD1.

The second connecting pad row CDA-2 may include a plurality of second connecting pads CD2, and the second connecting pads CD2 may be arranged in the direction of the second directional axis DR2. The second connecting pads CD2 may be electrically connected to the second panel pads PD2 of the display panel DP. For example, a first connection member AF1 that will be described later may be disposed between the second panel pads PD2 and the second connecting pads CD2.

The first connecting pads CD1 and the second connecting pads CD2 may be disposed on one end of the flexible board BF, and the plurality of third connecting pads CD3 may be disposed on the other end of the flexible board BF. The third connecting pads CD3 may be electrically connected to the driving circuit board MB that will be described later.

The connecting wires CL may be disposed between the first connecting pads CD1 and the second connecting pads CD2, which are disposed on the one end of the flexible board BF, and the plurality of third connecting pads CD3, which is disposed on the other end of the flexible board BF. The connecting wires CL may be disposed on the flexible board BF. Although all of the connecting pads CD1, CD2, and CD3 and the connecting wires CL are disposed on the one surface BF-T of the flexible board BF in the drawing, the inventive concepts are not limited thereto. For example, a portion of the connecting pads CD1, CD2, and CD3 and a portion of the connecting wires CL may be disposed on the other surface of the flexible board BF, which is different from the one surface BF-T, which faces the base substrate BS1, of the flexible board BF.

The protective layer SR may be disposed on the flexible board BF. The protective layer SR may be disposed on the flexible board BF to expose a portion of the connecting pads CD1, CD2, and CD3 and a portion of the connecting wire CL. That is, the connecting wire CL may be disposed between the flexible board BF and the protective layer SR in the direction of the third directional axis DR3. The protective layer SR may be a solder resist. The protective layer SR may be made of an epoxy resin or the like. The protective layer SR may prevent the connecting wires CL from being short-circuited by the connection members AF1 and AF2 and protect the connecting wires CL from an external impact.

The protective layer SR may have a portion overlapping the display panel DP. For example, an edge ED-SR of the protective layer SR, which is adjacent to the first connecting pads CD1 of the connecting circuit board FB, may overlap the base substrate BS1 of the display panel DP on a plane. The connecting circuit board FB may be disposed on the display panel DP so that the edge ED-SR of the protective layer SR is disposed on the base substrate BS1.

The minimum-spaced distance W3 between the first connecting pad CD1 and the edge ED-SR of the protective layer SR in the direction of the first directional axis DR1 may be equal to or greater than about 0.20 mm and equal to or less than about 0.50 mm. For example, the minimum-spaced distance W3 between the first connecting pad CD1 and the edge ED-SR of the protective layer SR in the direction of the first directional axis DR1 may be equal to or greater than about 0.20 mm and equal to or less than about 0.40 mm. The minimum-spaced distance W3 between the first connecting pad CD1 and the edge ED-SR of the protective layer SR in the direction of the first directional axis DR1 may be equal to or greater than about 0.20 mm and equal to or less than about 0.35 mm. Specifically, the minimum-spaced distance W3 between the first connecting pad CD1 and the edge ED-SR of the protective layer SR in the direction of the first directional axis DR1 may be about 0.20 mm.

When the spaced distance W3 between the first connecting pad CD1 and the edge ED-SR of the protective layer SR is less than about 0.20 mm, an adhesion surface area of the first connection member AF1 that will be described later may not be sufficiently secured, and thus, an adhesion property between the panel pads PD1 and the connecting circuit board FB may be degraded. Also, when the spaced distance W3 between the first connecting pad CD1 and the edge ED-SR of the protective layer SR is greater than about 0.50 mm, the base substrate BS1 may increase in length so that the edge ED-SR of the protective layer SR is disposed on the base substrate BS1, and, in this case, the dead space in the display device DD including the connecting circuit board FB may increase.

The minimum-spaced distance between the first panel pad PD1 corresponding to the first connecting pad CD1 and the edge ED-SR of the protective layer SR in the direction of the first directional axis DR1 may be equal to the minimum-spaced distance W3 between the first connecting pad CD1 and the edge ED-SR of the protective layer SR in the direction of the first directional axis DR1. The minimum-spaced distance W3 between the first panel pad PD1 and the edge ED-SR of the protective layer SR in the direction of the first directional axis DR1 may be equal to or greater than about 0.20 mm and equal to or less than about 0.50 mm. When the spaced distance between the first panel pad PD1 and the edge ED-SR of the protective layer SR is less than about 0.20 mm, the adhesion surface area of the first connection member AF1 that will be described later may not be sufficiently secured, and thus, the adhesion property between the panel pads PD1 and the connecting circuit board FB may be degraded. Also, when the spaced distance between the first panel pad PD1 and the edge ED-SR of the protective layer SR is greater than about 0.50 mm, the dead space in the display device DD including the connecting circuit board FB may increase.

Referring again to FIGS. 1 and 2, the display device DD according to an exemplary embodiment may include the driving circuit board MB. The driving circuit board MB may provide image data, a control signal, a power voltage, and the like to the display panel DP. The driving circuit board MB may include both active elements and passive elements. The driving circuit board MB may be a flexible wiring board or a rigid wiring board. The driving circuit board MB may be electrically connected to the display panel DP by suing the connecting circuit board FB. The driving circuit board MB may include a plurality of driving pads MP. The driving pads MP may be electrically connected to the third connecting pads CD3 of the above-described connecting circuit board FB. That is, one end of the connecting circuit board FB, on which the third connecting pads CD3 are disposed, may be disposed on the driving circuit board MB. The driving pads MP of the driving circuit board MB and the third connecting pads CD3 of the connecting circuit board FB may be electrically connected to each other through the second connection member AF2.

That is, the display panel DP, the connecting circuit board FB, and the driving circuit board MB may be electrically connected to each other through the connection members AF1 and AF2. Each of the connection members AF1 and AF2 may have an electrical conductivity and an adhesion property. Each of the connection members AF1 and AF2 may include a thermosetting material or a photocurable material. For example, each of the connection members AF1 and AF2 may include an anisotropic conductive film (ACF).

The first connection member AF1 may be disposed between the display panel DP and the connecting circuit board FB, and the second connection member AF2 may be disposed between the driving circuit board MB and the connecting circuit board FB. The first connection member AF1 and the second connection member AF2 may be same as each other. Alternatively, the first connection member AF1 and the second connection member AF2 may be different from each other.

Figure 8:
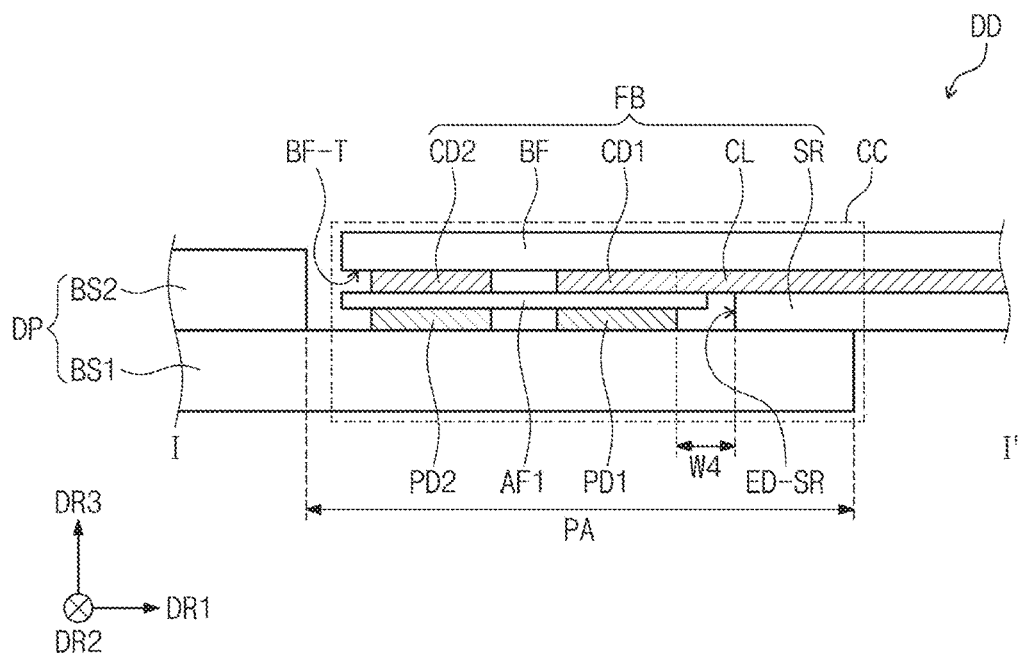
FIG. 8 is a cross-sectional view taken along line I-I' of FIG. 1.
Figure 9:
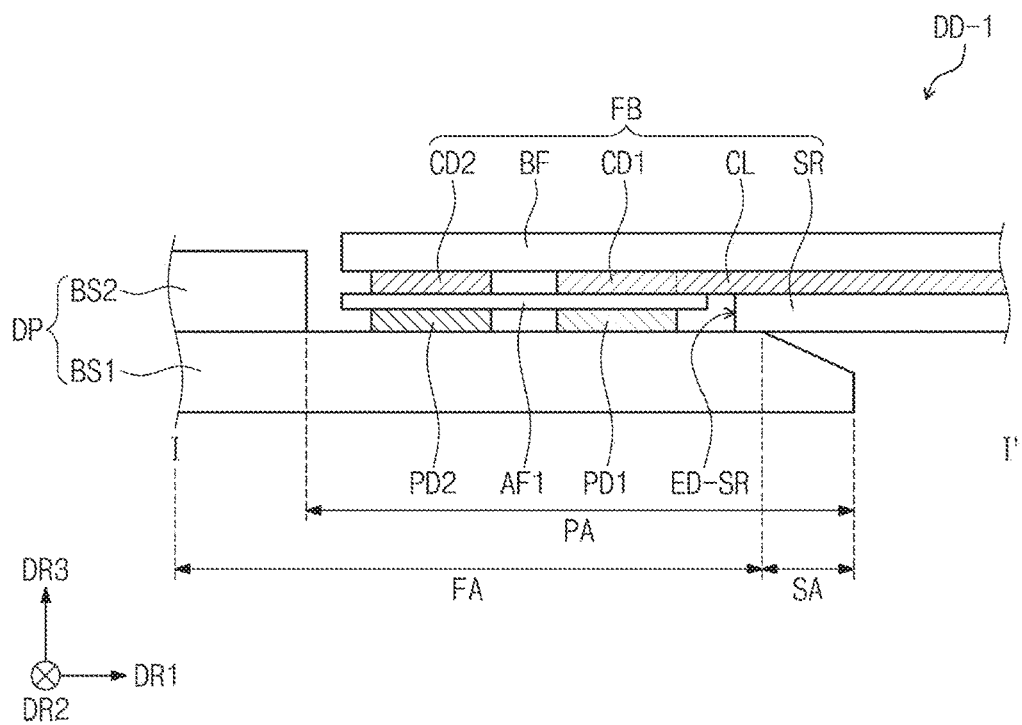
FIG. 9 is a cross-sectional view taken along line I-I' of FIG. 1.
Figure 10:
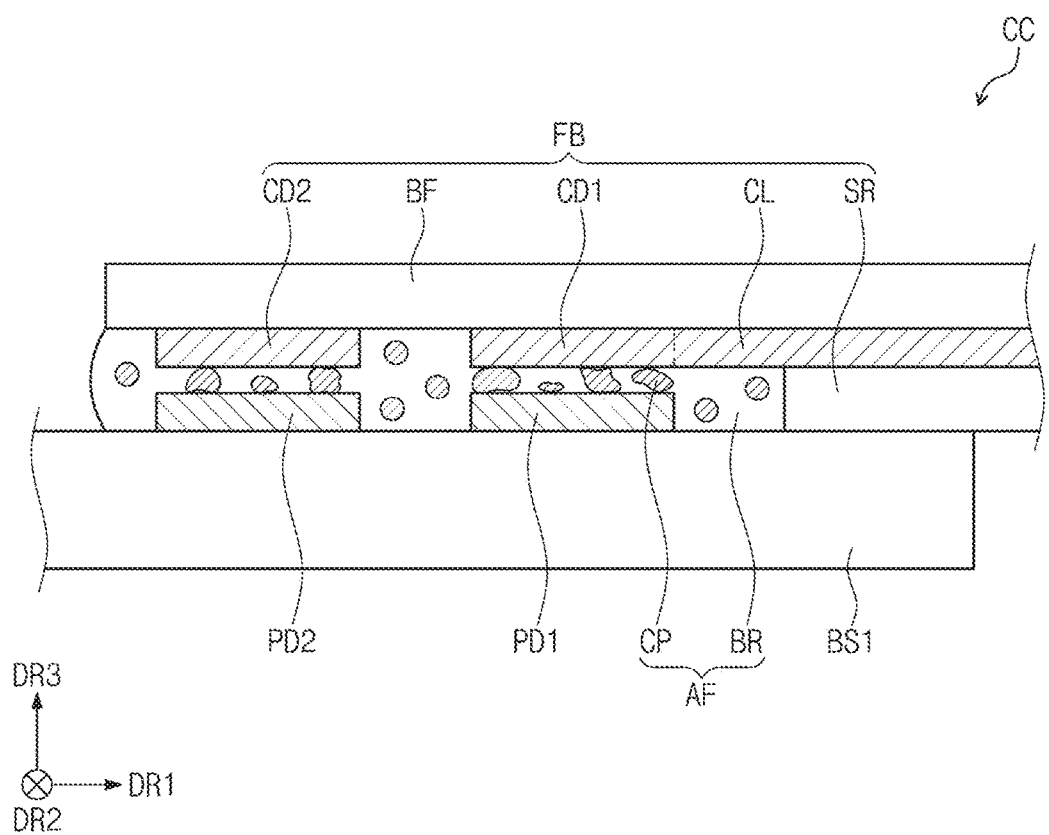
FIG. 10 is a cross-sectional view illustrating a region CC of FIG. 8.

FIGS. 8 and 9 are cross-sectional views taken along line I-I' of FIG. 1. FIG. 10 is a cross-sectional view illustrating a region "CC" of FIG. 8.

Referring to FIGS. 8 to 10, each of the connection members AF1 and AF2 may include a base resin BR and conductive particles CP. The base resin BR may be a thermosetting resin. For example, the base resin BR may be an acryl-based resin, an epoxy-based resin, and a urethane-based resin. The conductive particles CP may be metallic particles or alloy particles in which various kinds of metal are mixed. For example, the conductive particles CP may be metal or metal alloy particles including at least one of nickel, cobalt, chrome, and iron. The conductive particles CP may be distributed in the base resin BR.

The connection members AF1 and AF2 may have a flowability at a high temperature condition, and the first connection member AF1 disposed between the panel pads PD1 and PD2 and the connecting pads CD1 and CD2 may be filled between the flexible board BF and the base substrate BS1. FIG. 10 is a view illustrating the display device DD according to an exemplary embodiment in which the first connection member AF1 is filled between the flexible board BF and the base substrate BS1 to have flowability. The conductive particles CP may be deformed according to a temperature condition of heat applied to the first connection member AF1. For example, the conductive particles CP of the first connection member AF1 disposed between the panel pads PD1 and PD2 and the connecting pads CD1 and CD2 may be deformed in shape, and the panel pads PD1 and PD2 and the connecting pads CD1 and CD2 may be electrically connected to each other by the conductive particles CP.

Referring to FIGS. 8 and 9, the panel pads PD1 and PD2 and the connecting pads CD1 and CD2 may be electrically connected in a mutually corresponding manner on the pad area PA. A spaced distance W4 between the first panel pad PD1 and the protective layer SR of the connecting circuit board FB may be equal to the minimum-spaced distance W3 between the first connecting pad CD1 and the edge ED-SR of the protective layer SR in the direction of the first directional axis DR1, which is described in FIG. 7B.

The protective layer SR of the connecting circuit board FB may have a portion overlapping the base substrate BS1. A display device DD-1 in FIG. 9 is different in shape of one end of the base substrate BS1 from the display device DD in FIG. 8. In the display device DD-1 according to the exemplary embodiment illustrated in FIG. 9, the base substrate BS1 of the display panel DP may include a flat portion FA and an inclined portion extending from the flat portion FA and having a thickness gradually decreasing toward the edge of the base substrate BS1. The pad area PA of the display panel DP may include a flat portion FA and an inclined portion SA.

In the display device DD-1 according to the exemplary embodiment illustrated in FIG. 9, the panel pads PD1 and PD2 may be disposed on the flat portion FA of the base substrate BS1, and the edge ED-SR of the protective layer SR may be also disposed on the flat portion FA.

In each of the display devices DD and DD-1 in FIGS. 8 and 9, as a portion of the protective layer SR of the connecting circuit board FB overlaps the base substrate BS1, the connecting circuit board FB may be stably supported on the base substrate BS1. In particular, as the edge ED-SR of the protective layer SR is disposed on the flat portion FA of the base substrate BS1, the connecting circuit board FB may be further stably supported on the base substrate BS1. Also, as the first panel pad PD1 and the edge ED-SR of the protective layer SR are spaced by at least 0.20 mm, an adhesion property between the first panel pad PD1 and the connecting circuit board FB may be satisfactorily maintained even when the first connection member AF1 is deformed, or a portion of the first connection member AF1 extends towards the protective layer SR.

Table 1 below shows results obtained from an adhesion force and reliability evaluation test with respect to a display device according to an exemplary embodiment of the invention, and a typical display device of the prior art. In Table 1, a spaced distance indicates a distance between the edge of the protective layer and the first panel pad, and an adhesion force is obtained by evaluating an adhesion maintaining force between the first panel pad and the connecting circuit board. Also, a reliability value is obtained by evaluating an electrical connection performance between the first panel pad and the connecting circuit board. In Table 1, an exemplary embodiment indicates a display device when a spaced distance between the edge of the protective layer and the first panel pad is about 0.2 mm, and a Comparative Example indicates a display device when a spaced distance between the edge of the protective layer and the first panel pad is about 0.1 mm.

TABLE 1

| Classification | Spaced Distance (mm) | Adhesion Force | Reliability |
| --- | --- | --- | --- |
| Embodiment | 0.2 | Satisfactory | Satisfactory |
| Comparative Example | 0.1 | Fail | Fail |

Referring to the results of Table 1, in case of the Comparative Example in which the spaced distance between the edge of the protective layer and the first panel pad is less than about 0.20 mm, as a space between the edge of the protective layer and the first panel pad is not sufficiently secured, the adhesion surface area of the connection member for connecting the first panel pad to the connecting circuit board may not be sufficient, and accordingly, an adhesion force and electrical connection reliability between the panel pads and the connection circuit may not be satisfactory. Comparatively, in case of the exemplary embodiment in Table 1, as a spaced distance between the panel pad and the edge of the protective layer is about 0.20 mm, a satisfactory adhesion property and a satisfactory electrical connection reliability may be achieved.

The adhesion force and reliability may be evaluated according to whether an indentation is generated when the connection member is attached. In case of the Comparative Example, the indentation in the connection member provided on the first panel pad was weak or is almost not generated, and, in case of the illustrated exemplary embodiment, the indentation was generated in the connection member provided on the first panel pad at a level similar to that in the connection member provided in the second panel pad. As the pad area of the base substrate, on which the panel pads are disposed, increases in surface area to increase the contact surface area of the connection member disposed between the panel pads and the connecting circuit board, the electrical connection characteristics between the panel pads and the connecting circuit board may be enhanced.

Also, since the connecting circuit board and the panel pads may be connected to each other without a lift phenomenon even when the distance between the panel pads and the edge, which is adjacent to the panel pads, of the protective layer of the connecting circuit board is sufficiently secured, and the connection member extends, the display device according to an exemplary embodiment may improve the adhesion property between the display panel and the connecting circuit board and the electrical characteristics thereof.

In an exemplary embodiment, the spaced distance between the edge of the base substrate and the panel pad adjacent thereto may be optimized to improve the electrical connection performance between the panel pad and the connecting circuit board.

Also, in an exemplary embodiment, the spaced distance between the edge of the protective layer of the connecting circuit board and the panel pad adjacent thereto may be optimized to improve the adhesion property between the panel pad and the connecting circuit board.

Although certain exemplary embodiments have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
    a display panel comprising a base substrate, a plurality of pixels disposed on the base substrate, and a plurality of panel pad rows that are spaced apart from the pixels in a first direction, wherein each of the panel pad rows comprises a plurality of panel pads arranged in a second direction crossing the first direction in a perpendicular manner;
    a connecting circuit board disposed on the display panel and connected to the panel pads; and
    a connection member disposed between the display panel and the connecting circuit board to electrically connect the display panel to the connecting circuit board;
    wherein a minimum-spaced distance between an edge of the base substrate and the panel pads, which are adjacent to the edge of the base substrate, is equal to or greater than about 0.95 mm and equal to or less than about 1.25 mm.

2. The display device of claim 1, wherein the connecting circuit board comprises:
    a flexible board;
    a plurality of connecting pads disposed on the flexible board in correspondence to the panel pads; and
    a protective layer disposed on the flexible board.

3. The display device of claim 2, wherein an edge of the protective layer overlaps the base substrate.

4. The display device of claim 3, wherein a minimum-spaced distance between the edge of the protective layer and the panel pads, which are adjacent to the edge of the base substrate, is equal to or greater than about 0.20 mm and equal to or less than about 0.50 mm.

5. The display device of claim 2, wherein the base substrate comprises:
a flat portion, on which the panel pads are disposed; and
an inclined portion having a thickness that gradually decreases toward the edge of the base substrate.

6. The display device of claim 5, wherein an edge of the protective layer overlaps the flat portion on a plane.

7. The display device of claim 2, wherein the connection member is filled between the base substrate and the flexible board, which face each other.

8. The display device of claim 1, wherein the connecting circuit board comprises:
a flexible board comprising a connecting pad area;
a protective layer disposed on the flexible board to expose the connecting pad area; and
a plurality of connecting pad rows disposed on the connecting pad area,
wherein each of the connecting pad rows comprises a plurality of connecting pads corresponding to the panel pads.

9. The display device of claim 8, wherein a minimum-spaced distance between the edge of the protective layer and the panel pads, which are adjacent to the edge of the protective layer, is equal to or greater than about 0.20 mm and equal to or less than about 0.50 mm.

10. The display device of claim 1, wherein the panel pad rows comprises:
a first pad row adjacent to the edge of the base substrate and comprising a first panel pad; and
a second pad row in parallel to the first pad row and comprising a second panel pad.

11. The display device of claim 10, wherein a minimum-spaced distance between the first panel pad and the second panel pad adjacent to the first panel pad in the first direction is equal to or greater than about 0.15 mm and equal to or less than about 0.35 mm.

12. The display device of claim 10, wherein a minimum distance between a first imaginary line passing through a center of the first panel pad and a second imaginary line passing through a center of the second panel pad adjacent to the first panel pad and in parallel with the first imaginary line is equal to or greater than about 29 μm and equal to or less than about 33 μm.

13. The display device of claim 1, further comprising a driving circuit board electrically connected to the connecting circuit board and comprising a plurality of driving pads.

14. The display device of claim 1, wherein the display panel is a liquid crystal display panel, and the base substrate is a lower substrate of the liquid crystal display panel.

15. The display device of claim 1, wherein the display panel is an organic electroluminescent display panel comprising an organic light emitting element layer disposed on the base substrate and an encapsulation layer disposed on the light emitting element layer.

16. The display device of claim 1, wherein the connection member comprises a base resin and conductive particles.

17. The display device of claim 1, wherein each of the panel pads comprises at least one transparent metallic oxide of indium tin oxide (ITO), indium zinc oxide (IZO), indium tin zinc oxide (ITZO), zinc tin oxide (ZTO), and antimony tin oxide (ATO).

18. A display device comprising:
a plurality of panel pads divided into a display area, a non-display area, and a pad area on a plane and arranged in a form of a plurality of rows on the pad area;
a connecting circuit board comprising a flexible board, a plurality of connecting pads disposed on the flexible board and arranged in correspondence to the panel pads, and a protective layer disposed on the flexible board and having an edge overlapping the display panel;
a driving circuit board configured to provide a driving signal to the display panel and comprising a plurality of driving pads;
a first connection member disposed between the panel pads and the connecting circuit board; and
a second connection member disposed between the connecting circuit board and the driving circuit board,
wherein a minimum-spaced distance between a panel pad, which is adjacent to an edge of the display panel, of the panel pads and an edge of the protective layer is equal to or greater than about 0.20 mm and equal to or less than about 0.50 mm.

19. A display device comprising:
a display panel comprising a base substrate and a plurality of panel pads disposed in two rows on the base substrate while being adjacent to an edge of the base substrate;
a connecting circuit board electrically connected to the display panel; and
a connection member disposed between the connecting circuit board and the display panel,
wherein a minimum-spaced distance between a panel pad, which is adjacent to an edge of the base substrate, of the panel pads and an edge of the base substrate is equal to or greater than about 0.95 mm and equal to or less than about 1.25 mm.

20. The display device of claim 19, wherein the connecting circuit board comprises:
a flexible board;
a plurality of connecting pads disposed on the flexible board and disposed in correspondence to the panel pads; and
a protective layer disposed on the flexible board,
wherein an edge of the protective layer overlaps the base substrate on a plane.

* * * * *